United States Patent
Perrodin et al.

(10) Patent No.: US 11,635,341 B2
(45) Date of Patent: Apr. 25, 2023

(54) INTERNAL FAILURE DETECTION OF AN EXTERNAL FAILURE DETECTION SYSTEM FOR INDUSTRIAL PLANTS

(71) Applicant: DISTRAN AG, Zurich (CH)

(72) Inventors: Florian Perrodin, Zurich (CH); Joel Busset, Zurich (CH)

(73) Assignee: DISTRAN AG, Zurich (CH)

( * ) Notice: Subject to any disclaimer, the term of this patent is extended or adjusted under 35 U.S.C. 154(b) by 1020 days.

(21) Appl. No.: 16/348,918

(22) PCT Filed: Oct. 30, 2017

(86) PCT No.: PCT/IB2017/056733
§ 371 (c)(1),
(2) Date: May 10, 2019

(87) PCT Pub. No.: WO2018/087622
PCT Pub. Date: May 17, 2018

(65) Prior Publication Data
US 2019/0271610 A1  Sep. 5, 2019

(30) Foreign Application Priority Data

Nov. 11, 2016 (CH) .................................. CH01499/16

(51) Int. Cl.
| | | |
|---|---|---|
| *G01M 3/14* | (2006.01) | |
| *G01M 3/24* | (2006.01) | |
| *G01M 13/028* | (2019.01) | |
| *G01M 13/045* | (2019.01) | |
| *H04R 19/00* | (2006.01) | |
| *H04R 19/02* | (2006.01) | |

(Continued)

(52) U.S. Cl.
CPC .............. *G01M 3/243* (2013.01); *G01M 3/14* (2013.01); *G01M 13/028* (2013.01);
(Continued)

(58) Field of Classification Search
CPC ...... G01M 3/14; G01M 3/243; G01M 13/028; G01M 13/045; H04R 3/005
See application file for complete search history.

(56) References Cited

U.S. PATENT DOCUMENTS

| | | | | |
|---|---|---|---|---|
| 2009/0296946 | A1* | 12/2009 | Zhang | ............... H04R 29/005 381/58 |
| 2012/0045068 | A1 | 2/2012 | Kim et al. | |

FOREIGN PATENT DOCUMENTS

JP         2001045590 A  *  2/2001  ............. H04R 3/005

OTHER PUBLICATIONS

Van Veen et al., "Beamforming: a versatile approach to spatial filtering", IEEE ASSP Magazine, Apr. 1988, pp. 4-24.

(Continued)

*Primary Examiner* — David Z Huang
(74) *Attorney, Agent, or Firm* — Workman Nydegger (57) ABSTRACT

An internal failure detection method of an external failure detection system for industrial equipment, the external failure detection system including an array of transducers, the method including: (a) receiving a plurality of signals, each signal being measured by a corresponding transducer of the transducers array; (b) for each pair of transducers among a number of pairs of transducers, calculating at least one value of a correlation parameter between the pair of signals received at step (a) at the pair of transducers, by correlating at least part of the signals or of invertible transforms thereof; (c) for at least one transducer among the number of pairs of transducers, estimating from the values of the correlation parameters calculated at step (b) if the transducer is working properly.

20 Claims, 3 Drawing Sheets

(51) Int. Cl.
*H04R 3/00* (2006.01)
*G01R 31/27* (2006.01)
(52) U.S. Cl.
CPC ......... *G01M 13/045* (2013.01); *G01R 31/275* (2013.01); *H04R 3/005* (2013.01); *H04R 19/005* (2013.01); *H04R 19/02* (2013.01); *H04R 2201/003* (2013.01); *H04R 2430/20* (2013.01)

(56) References Cited

OTHER PUBLICATIONS

International Search Report and Written Opinion, dated Feb. 2, 2018, from corresponding PCT application No. PCT/IB2017/056733.

Azaria, Mordechai and Hertz, David, "Time Delay Estimation by Generalized Cross Correlation Methods," IEEE Transactions on Acoustics, Speech and Signal Processing, vol. ASSP-32, No. 2, Apr. 1984, pp. 280-285.

Chung et al., "Detection of the Number of Signals Using the Benjamini-Hochberg Procedure," IEEE Transactions on Signal Processing, vol. 55, No. 6, Jun. 2007, pp. 2497-2508.

Dmochowski et al., "A Generalized Steered Response Power Method for Computationally Viable Source Localization," IEEE Transactions on Audio, Speech and Language Processing, vol. 15, No. 8, Nov. 2007, pp. 2510-2526.

Eret, Peter and Meskell, Criag, "Microphone arrays for compressed air leakage detection," 4th Berlin Beamforming Conference 2012, pp. 1-14.

McCowan et al., "Microphone Array Shape Calibration in Diffuse Noise Fields," IEEE Transactions on Audio, Speech and Language Processing, Apr. 2008.

\* cited by examiner

INTERNAL FAILURE DETECTION OF AN EXTERNAL FAILURE DETECTION SYSTEM FOR INDUSTRIAL PLANTS

The invention concerns failure detection within an industrial plant.

In particular, ultrasound gas leak detection is used in environments where pressured gases are used. Detectors comprise a single or multiple ultrasonic transducers that trigger an alert if the sound level exceeds a certain threshold.

The Applicant has designed a failure detection device comprising a transducer array to detect gas leaks of industrial equipment or other possible failure, e.g. wear of a bearing.

Each transducer is able to measure a sound signal, and the signals measured by a plurality of transducers are processed so as to localize a possible leak.

Ensuring that these systems properly work is extremely important as not detecting a gas leak may cause material losses, injuries and deaths.

Thus a self-check is implemented in most of the devices to warn the user if a detector is malfunctioning.

The self-check is commonly implemented using an active emitter at regular intervals (e.g., 15 min), such as a simulated gas leak or an acoustic transducer.

Aside from the additional cost of putting an active emitter and the complexity of having it explosion proof, such an emitter adds points of failure: the emitter and its electronics may fail as well. Additionally, the power consumption from the emitter is not negligible especially in installations where energy is scarce. Other problems include detectors triggering an alert because of the self-test function of a neighboring detector.

One may consider performing a self-passive checking, such as checking the evolution of a background noise, but it would be difficult to know whether the change of the background is due to a change of the environment or due to a failure of the transducer.

There is a need for a reliable internal failure detection of an external failure detection system for industrial equipment that would operate without a dedicated source.

There is provided an internal failure detection method of an external failure detection system for industrial equipment, said external failure detection system comprising an array of transducers, the method comprising (a) receiving a plurality of signals, each signal being measured by a corresponding transducer of the transducers array, (b) for each pair of transducers among a number of pairs of transducers, calculating at least one value of a correlation parameter between the pair of signals received at step (a) at said pair of transducers, by correlating at least part of said signals or of invertible transforms thereof, (c) for at least one transducer of the transducers array, estimating from the values of the correlation parameters calculated at step (b) if said transducer is working properly.

This method allows detecting a possible failure without a dedicated source.

The method thus allow saving costs and space.

Further, the design may be easier since there is no need to provide a dedicated source.

Further, explosion proofing may be easier because less parts are exposed to the gas and less energy is stored in the device).

Also, power consumption is reduced (emitting consumes far more power than receiving), and problems related to the active self-testing (such as triggering detectors nearby) are suppressed.

The present invention also reduces the failure rate of the detection by not having additional active parts that may fail.

The correlations are made on the measured signals or on invertible transforms thereof, that is on raw signals or at least on signals including detailed information, not on features obtained individually from each signal, thus allowing a fine and reliable internal failure detection.

This method allows differentiating between environmental changes and internal changes, thus providing a reliable way to check the health status of the transducers.

The correlation parameter may be obtained by performing a cross-correlation in the traditional sense, or an equivalent thereof as long as the phase shift (equivalently the time-delay) information between the signals is used to obtain the correlation parameter. The correlation parameter may be obtained by beamforming, by performing a convolution, a cross-correlation, or by calculating a cross-spectral density for example.

Advantageously, at least two transducers, and preferably all the transducers, have an overlapping field of view. When a sound source is emitting in this overlapping field of view and in the range of the transducers sensitivities, the corresponding signal is perceived by a plurality of transducers. Cross checking the signal from one transducer to another transducer may enable to check whether these two transducers are working properly. With more transducers the consistency of the transducer signals can be further checked.

Advantageously, the array of transducers may be highly redundant. If an acoustic transducer is failing, it can be marked as failing while the other transducers may still function. The failing transducer can be disabled which will affect in a predictable way the change of sensitivity of the detector.

Advantageously, the method may further comprise, prior to step (b), performing an invertible frequency transform on the received signal, e.g., a Short Term Fourier Transform, a Fast Fourier Transform, a Cosines Transform, a wavelet transform, or other.

This may allow performing the correlations of step (b) on only the part of the transform signals that correspond to relevant frequencies. For example, for gas leak detection, transducers may advantageously work within the band 20 kHz-40 kHz. The correlations may be done based on samples of the frequency transforms of the received signals that are within this band 20 kHz-40 kHz.

In an embodiment, the method may comprise a dimension reduction step, e.g. by adding correlation values. But alternatively, the estimating may be performed without loss of information.

Advantageously, the method may further comprise determining a number of sound sources from the correlation parameters calculated at step (b), and selecting a transducer condition estimating method depending on the determined number of sources.

The invention is not limited to a number of sources determination.

For example, the method may comprise a beamforming analysis without estimating of the number of sources. For example, after step (a), step (b) may comprises performing beamforming (without knowing the number of sources) for several subsets of transducers, e.g. with a steered response power (SRP) method. That is, the correlation parameter calculated at step (b) may be a sum over time of products of time shifted received signals. The source locations may be obtained from the correlations parameters, and step (c) may comprise checking that the found source locations are consistent one with the others and possibly detecting a transducer failure in case of inconstancy. Part of this algorithm is described with more detailed with reference to FIG. 2, in particular to block 208. This method may be well adapted if the external detection device is in an environment with one or more sound sources.

Figure 2:
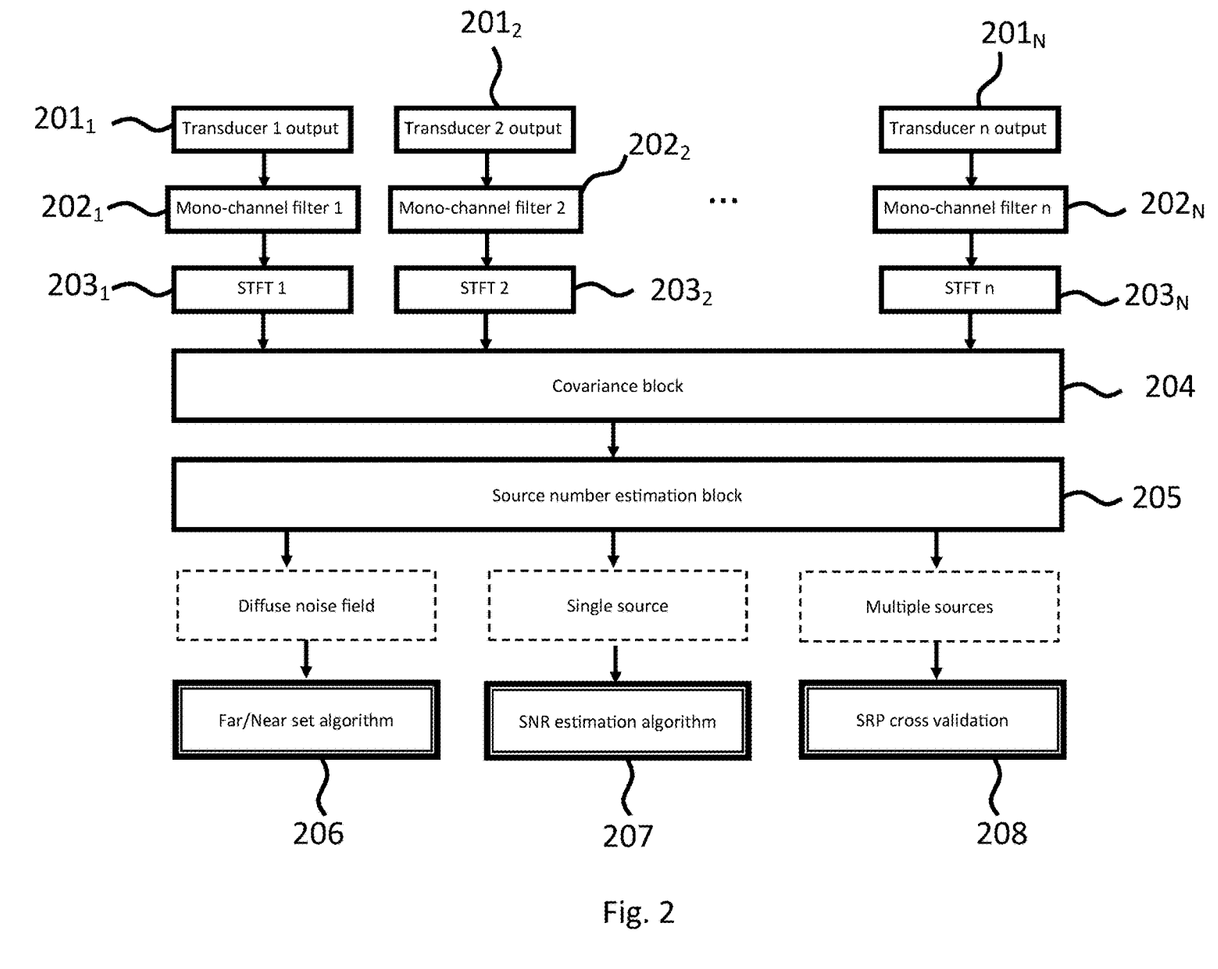
FIG. 2 schematically shows an example device according to an embodiment of the invention.

According to another example, the method may comprise, after step (a), basing the failure detection on a diffuse noise field, as in the algorithm explained in more details with reference to block 206. The correlation parameter calculated at step (b) may for example comprise a cross spectral density. For at least one transducer, the cross spectral values obtained from a Fourier transform of the signal at said transducer and the Fourier transform of the signal at another transducer may be compared to a theoretical value so as to estimate whether said transducer is working properly or is failing.

Advantageously, when a number of sources is determined, determining the number of sound sources may comprise advantageously, selecting a time interval and a frequency band, at step (b), calculating a correlation parameter for each pair of transducers taken from a set of transducers of the array, advantageously from parts of invertible transforms of the corresponding signals, said parts corresponding to the selected time interval and frequency band, estimating eigenvalues of a correlation matrix having as coefficients the correlation parameters calculated at step (b), e.g. a cross spectral matrix, counting the number of estimated eigenvalues that are higher than a threshold, e.g. a percentage of the highest eigenvalue or a predetermined threshold, if said counted number is higher than a further threshold, e.g., 8 or 10, or equals zero, considering that the number of sources is zero, otherwise, considering that the number of sources equals the counted number.

Advantageously, when the determined number of sound sources equals zero, the method may comprise, for at least one correlation parameter calculated at step (b), comparing said calculated correlation parameter to a theoretical value obtained based on a diffuse noise field model.

Advantageously, the comparing may comprise calculating a normalized value of the correlation parameter from the correlation parameter calculated at step (b).

Advantageously, the comparing may comprise calculating a theoretical value of said normalized correlation parameter.

Advantageously, the comparing may comprise calculating a sum of absolute squared differences.

In an alternative embodiment, the method may further comprise, when the determined number of sound sources equals zero, for at least one transducer, comparing to a threshold, e.g. a predetermined threshold or a calculated threshold, at least one correlation parameter obtained at step (b) from the signal received at said transducer and from the signal received at a distinct transducer that is considered as being located near said transducer, and/or comparing to a threshold, e.g. a predetermined threshold or a calculated threshold, at least one correlation parameter obtained at step (b) from the signal received at said transducer and from the signal received at a distinct transducer that is considered as being located far from said transducer. For this transducer, if when its correlation with the nearby set is high and its correlation with the far set is low, this transducer may be considered as working properly.

Advantageously, when the determined number of sound sources equals one or more, the method may comprise selecting at least two different subsets of transducers, each subset of transducers comprising a number of transducers that is smaller than the number of active transducers within the array, for each selected subset of transducers, and for at least one detected source, (advantageously for each detected source), estimating from the signals received at step (a) at the transducers of said subset, a location of said source, and checking that the at least two estimated locations of said source are consistent.

Advantageously, the location estimating may be done using a steered response power (or SRP) algorithm.

Advantageously, when the determined number of sound sources equals one, the method may comprise for at least one pair of two transducers, computing a convolutional product from the signals received at said transducers, determining from the at least one computed convolutional product a signal to noise ratio for at least one transducer, comparing the determined signal to noise ratio to a threshold to estimate the state of the corresponding transducer.

Advantageously, the signal to noise ratio (or SNR) is estimated based on models of the signals received at the transducers of the pair of transducers.

Advantageously, the received signal at a transducer may be modeled as:

$$m_i(t) = \alpha_i s(t-\delta_i) + \eta_i(t)$$

where: $m_i(t)$ is the output of the microphone i at time t, s is the incoming signal scaled so that its variance is equal to 1, $\alpha_i > 0$ is the product of the gain of the microphone i with the variance of the incoming signal, $\delta_i$ is the time delay of propagation and $\eta_i$ a centered second-order stationary process, with variance $\eta_i$, representing the self-noise of microphone i, assumed to be independent on each microphone.

That is, determining the SNR at each microphone may comprise determining the ratio $$\frac{\alpha_i}{n_i}$$

Advantageously, the correlation parameter calculated at step (b) from the signals received at a pair of transducers may be a cross spectral density between said received signals.

Advantageously, at step (b), the correlation parameter may be calculated according to $$\phi_{ij}(f) = \sum_T m^\dagger_{i,c}(f) m_{j,t}(f)$$

Where i and j are indices for the transducers, $m_{i,t}(f)$ is the microphone response around frequency f and around time t; it may for example be computed from the received signal using a Short-Term Fourier transform for example, † operator denotes the Hermitian transpose operator, $\phi_{ij}(f)$ is the correlation parameter for the transducers i,j.

There is also provided a computer readable medium storing computer executable code which when executed by a processor causes the processor to carry out the method described herein above. The medium may be any entity or device capable of storing the program. For example, the medium can comprise a storage means, such as a ROM, for example a CD ROM or a microelectronic circuit ROM, or else a magnetic recording means, for example a diskette (floppy disk) or a hard disk.

There is also provided a computer program product comprising instructions for carrying out the method described herein above when the program is executed by a processor. These programs can use any programming language, and be in the form of source code, binary code, or of code intermediate between source code and object code such as in a partially compiled form, or in any other desirable form for implementing the methods according to the invention.

There is also provided an internal failure detection device for an external failure detection system for industrial equipment, said external failure detection system comprising an array of transducers, the internal failure detection device comprising receiving means to receive a plurality of signals, each signal being measured by a corresponding transducer of the transducers array, processing means arranged to, for each pair of transducers among a number of pairs of transducers, calculate at least one value of a correlation parameter between the pair of signals corresponding to said pair of transducers, by correlating at least part of said signals or of invertible transforms thereof, and to, for at least one transducer of the number of transducers, estimate from the calculated values of the correlation parameter if this transducer is working properly, and transmitting means to transmit a signal generated as a function of the result of the estimation so as to report a possible transducer failure.

This device may for example comprise or be part of one or several processors. The device may be a card or a processor for example.

The receiving means may for example comprise an input pin, an input port, a communication module, or other.

The processing means may for example comprise a CPU (for Central Processing Unit) core, or other.

The transmitting means may for example comprise an output pin, an output port, a communication module, or other.

There is also provided an external failure detection system for industrial equipment, comprising an array of transducers and an internal failure detection device as described herein above to detect a possible failure of one or several of the transducers of said array.

The external failure detection system may for example be arranged to detect gas leaks of the industrial equipment.

Alternatively, the system may be arranged to detect a change in the noises emitted by ball, roller or friction bearings, and to estimate a state of wear and tear.

Advantageously, the external detection may be based on the analysis of sound signals recorded at the transducers.

Advantageously, the system may be arranged for non destructive test of the industrial equipment based on a passive recording of audio and ultrasound signals at the transducers.

Advantageously, the transducers may be microphones, e.g. MEMS (for Micro-Electrical-Mechanical System) microphones.

Advantageously, the transducers have good sensitivities in the ultrasound frequency range, advantageously in the 20 kHz-40 kHz band.

Alternatively, the transducers may comprise Hall effect sensors, air flow sensors, photodiodes, cameras, or other.

The invention is explained in further detail, and by way of example, with reference to the accompanying drawings wherein FIG. 1 schematically shows an example system according to an embodiment of the invention.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the invention. Moreover, for the purpose of clarity, detailed descriptions of well known devices, circuits, tools, techniques and methods are omitted so as not to obscure the description of the present system. It should be expressly understood that the drawings are included for illustrative purposes and do not represent the scope of the present system. In the accompanying drawings, like reference numbers in different drawings may designate similar elements.

Figure 1:
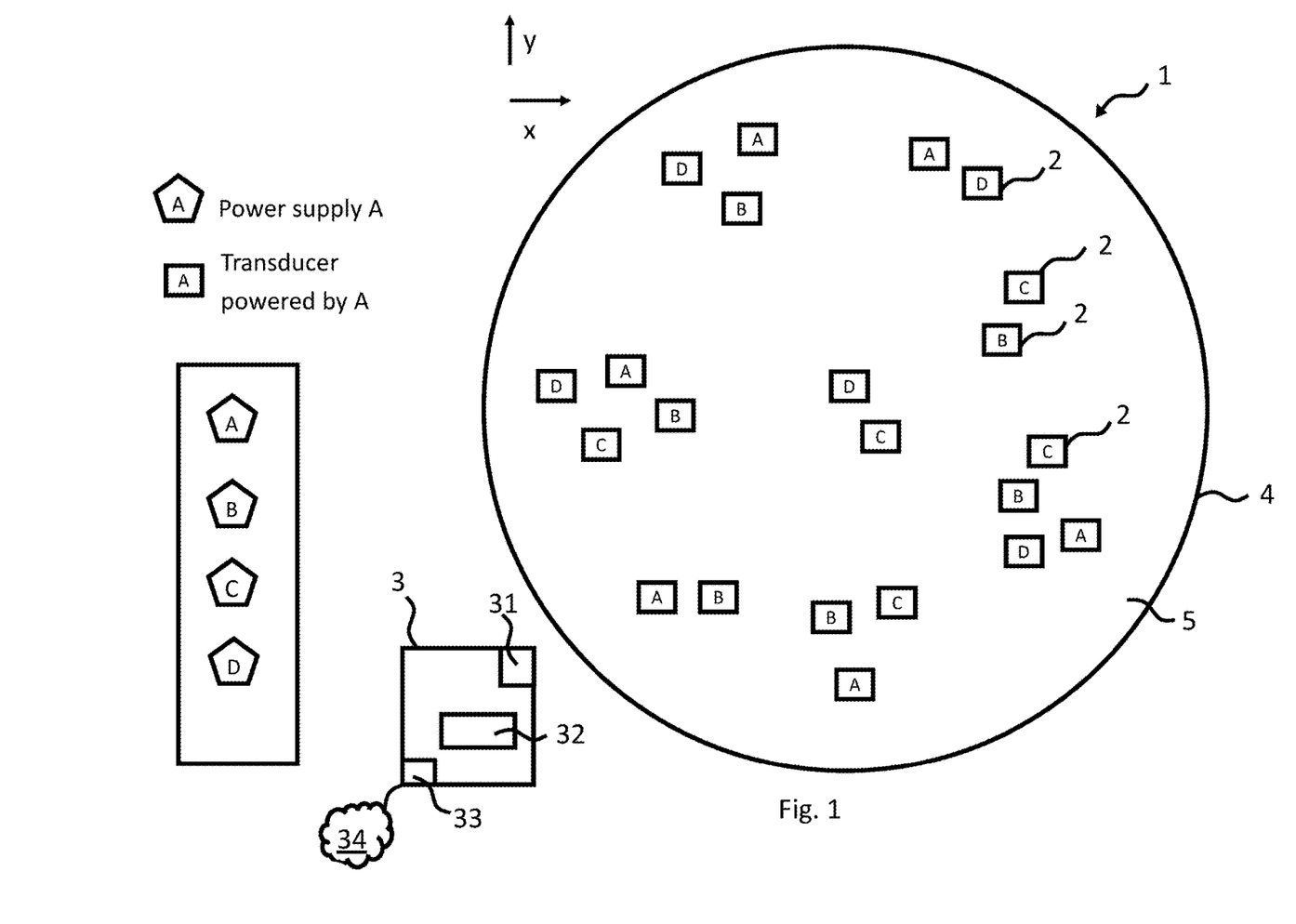

An external failure detection system 1 as illustrated in FIG. 1 may comprise a transducers array 4 comprising a plurality of transducers 2, e.g. of MEMS microphones 2.

The MEMS microphones are spread at different locations on a two dimensional plate 5, i.e., the array 4 is planar.

In an alternative, not illustrated, embodiment, the transducer array may be 3D shaped.

The MEMS microphones 2 may be arranged so as to record audio and ultrasound signals.

The system 1 allows non destructive test of an industrial equipment, e.g. pipes, tanks, or so.

The external detection is based on a passive recording of audio and ultrasound signals at the MEMS microphones 2, said "passive emission".

The MEMS microphones allow measuring the possible sound pressure waves generated by the flow of gas from a high pressure enclosure via a leak within a wall of this enclosure.

The system 1 comprises an electronic board 3 with a wireless communication module 31 arranged to receive signals from the MEMS microphones 2 and a processor 32 in communication with the wireless communication module 31.

The processor 32 is arranged to perform leak detection based on the signals received at the MEMS microphones 2. This processor 32 may perform a source localization algorithm, based for example on beamforming, e.g. on SRP, thus allowing not only to detect the presence of a leak but also to provide a localization of the detected leak.

Such algorithm is for example described in Microphone Array for Air Leakage Detection by Petr Eret and Craig Meskell published in Berlin Beamforming Conference 2012 (BeBeC 2012). In this paper, a type of beamforming algorithm, orthogonal beamforming, is used to locate air leaks. A superimposition of an optical image from a digital camera and of an acoustic image (the output of the beamforming algorithm) allows to show in real-time the potential leak locations, which correspond to the maxima of the image. Though electret microphones were used, there is nothing specific to this microphone technology and those of ordinary skill in the art would easily implement this method with MEMS microphones. Other possible types of beamforming are described in Beamforming: a versatile approach to spatial filtering by Barry D. Van Veen and Kevin M. Buckley published in IEEE ASSP magazine of April 1988, which present different types of beamformers that have optimal performance and characteristics depending of different use cases.

The processor 32 is connected to an output port 33 in communication with a terminal (not illustrated), for example via a network such as the Internet 34.

In case a leak is detected, the processor 32 generates an alarm messages that is transmitted to this terminal so as to report the problem.

Ensuring that the system properly work is crucial as not detecting a gas leak may cause material losses, injuries or deaths.

Dangerous situations occur when the detection system is failing silently: a user think he is protected but in fact he is not.

Failure that can happen comprise: failure of part or whole of power supply, mechanical or electric failure of part or whole sensing elements, external mechanical blocking of part or whole sensing elements (ice, dust).

Power supply failure may be easily addressed by known techniques, such as actively pinging the device.

In the embodiment of FIG. 1, multiple independent power supplies are used to power the MEMS microphones 2, thus making the system quite robust.

In this example, four power supply A, B, C and D, are used. It will be appreciated that the MEMS microphones powered by a given source A, B, C or D are spread all over the plate 5.

When choosing which power supply will be connected to which sensor, it is preferable to power sensors that are nearby with different power supply. Nearby transducers hence have different power supplies. Thus a correlation between two nearby transducers will only be caused by a sound from the environment (diffuse noise model) and not due to the power supply noise.

In the illustrated example, 4 different power supplies are used to power the different transducers. One can see that all nearby transducers have, when it is possible, different power supplies.

This power supply arrangement may allow decoupling potential problems that could happen from the power to the problems from the transducers.

In one embodiment, each microphone to be tested has at least one neighbor in a close neighborhood, e.g. closer than 1 cm (for f=14 kHz, c=343 m·s$^{-1}$).

The card 3 is arranged so as to perform a self-check, said internal detection, so as to check that the MEMS microphones 2 are working properly.

The self-test performed by the card 3 may be done without a dedicated source.

Fourier transforms of the signals received at the MEMS microphones 2 are correlated one to the other so as to detect a possible failing microphone.

Advantageously, the self-test is performed regularly, e.g. every 15 minutes, or every hour.

Referring now to FIG. 2, which illustrates an exemplary self-test device, the blocks $201_1$, $201_2$, ..., $201_N$, allow receiving the signals recorded by the N MEMS microphones.

Each MEMS microphone may be connected to an analog-to-digital converter (not represented) and the signals received at the blocks $201_1$, $201_2$, ..., $201_N$, may already be in a digital form.

The blocks $201_1$, $201_2$, ..., $201_N$, may for example be part of the wireless communication module referenced as 31 in FIG. 1.

The device further comprises filter blocks $202_1$, $202_2$, ..., $202_N$, for example within the processor referenced as 32 in FIG. 1.

Each mono-channel filter allows testing a corresponding MEMS microphone for trivial cases of failure: null output, big discrepancy between the microphone and the others (e.g., threshold on difference on the sound pressure level of an individual microphone and the mean of the others).

Then, each received signal undergoes an invertible transform, e.g. a Short Term Fourier Transform, in a corresponding block $203_1$, $203_2$, ..., $203_N$.

All the frequency signals $m_{1,t}(f)$, $m_{2,t}(f)$, ..., $m_{N,t}(f)$, at frequency f around time t, at the output of the invertible transform blocks $203_1$, $203_2$, ..., $203_N$ are collected at a covariance block 204 of the processor 32.

For example, the method may comprise selecting a time interval and a frequency band F.

In this covariance block 204, a cross spectral matrix $\phi(f,T)=[\phi_{ij}(f)]_{i,j}$ is estimated, wherein i and j run from 1 to N, N being the number of MEMS microphones of the array that has not been already marked as failing, and $\phi_{i,j}$ is a correlation parameter, here a cross-spectral density, between the signals received at the MEMS microphones i and j.

The cross spectral density $\phi_{ij}(f)$ for a given frequency f may be calculated using $$\phi_{ij}(f) = \sum_T m^\dagger_{i,t}(f) m_{j,t}(f) \qquad (1)$$

In the covariance block 204, the covariance estimation time may for example be fixed beforehand.

The covariance matrix is sent to a source number estimation block 205, wherein it is processed so as to estimate the number of sound sources.

Estimating the number of sources may be done by multiple techniques known by those skilled in the art, such as the one described in P. J. Chung, J. F. Bohme, C. F. Mecklenbrauker and A. O. Hero, "Detection of the Number of Signals Using the Benjamini-Hochberg Procedure," in IEEE Transactions on Signal Processing, vol. 55, no. 6, pp. 2497-2508, June 2007.

For example, the method may comprise estimating the eigenvalues of the covariance matrix $\phi$ (for example using the singular value decomposition method).

Each eigenvalue may be compared to a threshold, and the number of eigenvalues that are higher than this threshold may be written in a memory.

The threshold may for example be chosen equal to $\delta \cdot e_0$ where $\delta \in ]0,1[$, and $e_0$ is the highest eigenvalue among the calculated eigenvalues. For example $\delta=0.2$.

This number is denoted as $\tilde{M}$.

If $\tilde{M}$ is higher than a further threshold, e.g., 8, the field can reasonably be modeled as a diffuse noise field, and the covariance matrix may be sent to the block 206 that will be described hereinafter. When no dominant sound source is present (very quiet indoor), the model of diffuse noise field can be used.

Otherwise it is considered that the number M of sources is equal to $\tilde{M}$.

If M=1, the covariance matrix may be sent to block 207 and/or to block 208.

If M equal 2 or more, the covariance matrix may be sent to block 208 only.

The blocks 206, 207, 208 output a decision regarding the integrity of the MEMS microphones.

It will now be described how the check is performed in case no source is detected (diffuse noise field model).

A diffuse noise field is known in the literature as an isotropic sound field where sound comes from every direction with same power.

The complex coherence function at frequency f between two distinct MEMS microphones indexed by i and j may defined as $$\Gamma_{ij}(f) = \frac{\phi_{ij}(f)}{\sqrt{\phi_{ii}(f)\phi_{jj}(f)}} \quad (2)$$

where $\phi_{ij}$ is the cross-spectral density between the signals i and j.

Theoretical cross-correlation from a diffuse noise field may be analytically derived as:

$$\Gamma_{ij}^{diffuse}(f) = sinc\left(\frac{2\pi f d_{ij}}{c}\right) \quad (3)$$

where c is the speed of the sound in the medium, e.g., the air, and $d_{ij}$ the distance between the MEMS microphones i and j and sinc the sinus cardinal function.

It depends on the distance of the two transducers and the frequency considered.

The method may comprise:
defining a set of pairs of microphones (could be all the pairs, or a subset if computing power is limited), a frequency domain F at which the transducers will be tested and a time domain T.
for each pair (i,j) and for a set of frequencies {f|f∈F} estimate $\Gamma_{ij}^*(f)$ from $\phi_{ij}(f)$, $\phi_{ii}(f)$ and $\phi_{jj}(f)$ using formulas (1) and (2), and estimate a theoretical cross correlation using formula (3),
Estimating a difference $Q_{ij}$ according to $$Q_{ij} = \sum_{f \in F} |\Gamma_{ij}(f) - \Gamma_{ij}^{diffuse}(f)|^2$$

If $Q_{ij}$ is lower than a threshold a, adding this pair of MEMS microphones to a set of working pairs W.

These steps may be repeated for a number of pairs. For each MEMS microphone, it is determined if this microphone belongs to at least on pair of W. If it not the case, the MEMS microphone is marked as defective.

This method thus allows detecting if a microphone is working. The theoretic diffuse noise field cross-correlation function is matched with the actual one and the sum of absolute squared differences (SASD) is computed.

If the result is higher than a threshold, one transducer in the pair being checked is malfunctioning. By using at least 3 microphones (to make two pairs) the faulty microphone can be isolated.

The method can be made more robust using random sample consensus methods (RANSAC).

Another method using diffuse noise field is to determine the distances between the microphone by fitting the cross correlation function and checking if the distances are correctly determined. (I. McCowan, M. Lincoln, and I. Himawan, "Microphone array calibration in diffuse noise fields," IEEE Trans. on Audio, Speech, and Language Processing, vol. 16, pp. 666-670, 2008).

In an alternative embodiment, the method may comprise, for each microphone i, splitting the set of the other microphones between those located near the microphone i $N_i=\{k|d_{ik}<\beta\}$ and those located far $F_i=\{k|d_{ik}\geq\beta\}$.

The limit $\beta$ is determined by finding the smallest distance d such that $r_d^{diffuse}(f)=K$ with K a positive constant preferably bigger than $$\frac{2}{5\pi}$$

(to avoid indetermination due to the non-monotonicity of the sinc function).

A microphone is considered as working properly when its correlation with the nearby set is high and its correlation with the far set is low.

Every other case denote a failure: low correlation near and far indicate the microphone has lower SNR; high far correlation indicate that correlated signals from electrical problems are occurring.

It is preferable to have a non-empty near set $N_i$ for each microphone i. If K=0.2 for example, $$\beta = \frac{2.59574...c}{2\pi f}$$

which gives $\beta=1$ cm for c=343 m·s$^{-1}$, f=14 kHz. So each microphone to be tested may have at least one neighbor closer than 1 cm.

To improve resistance to failure, the power supply of nearby microphones should be different, as illustrated in FIG. 1, to avoid microphone that are nearby to have correlated power inputs.

It will now be described how the failure detection is performed in case one or more source(s) is detected (block 208).

When multiple sound sources are present, steered response power (SRP) class of algorithm combined with RANSAC can be used to classify microphones sets. SRP algorithm aims to locate sound sources by finding the maxima of beamformers steered at variable positions in the space.

The block 208 may comprise selecting means to select a subset of transducers among the N transducers to determine the location of the sources and determine whether all microphones agree on the position.

A good agreement between the microphones indicate that the set of selected MEMS microphones is working.

An example of a source locating technique is presented in J. P. Dmochowski, J. Benesty and S. Affes, "A Generalized Steered Response Power Method for Computationally Viable Source Localization," in IEEE Transactions on Audio, Speech, and Language Processing, vol. 15, no. 8, pp. 2510-2526, November 2007.

The block 208 may be arranged so as to implement a basic source locating technique. For example, the point of focus of a beamformer (e.g. delay-and-sum) may be adjusted so that the output power of the beamformer is maximized.

The optimization problem has thus three variables to optimize.

The point of focus that maximize (locally) the function is a sound source.

Multiple initialization points enable to find multiple sound sources.

The optimization can be solved classically using gradient descent algorithm or more sophisticated techniques.

The method to determine the defective microphones may comprise:

(step 1) Randomly choosing K microphones (test set).

(step 2) Using SRP algorithm (or any other sound source locating algorithm) to find the locations and the M active source $L_M = \{l_1, l_2 \ldots l_M\}$.

(step 3) For each microphone not in the test set, computing the source location using the test set and the microphone to find $L'_M = \{l'_1, l'_2 \ldots l'_M\}$.

(step 4) If $R = \sum_{i=1}^{M} \|l'_i - l_i\|$ lower than a threshold $\mu$, adding it to the inlier set.

(step 5) If there a sufficient number of inlier (typically 90% of the number of microphones or a number dependent of the number of independent power supply), refining the model using all the inliers and determining the outliers, i.e. the defective microphones. If there is not enough inliers, reiterate steps 1 to 5.

K should be as small as possible to determine the source location but sufficiently high to be able to determine the individual location of the sources.

Typically K can be chosen using the following formula: K=3+M where M is the number of active sound sources at the time and frequency band being studied.

A simultaneous degradation of all the transducers may happen, e.g. if dust is blocking the membrane of the MEMS microphone (or any part of the acoustic path). This may be detected by estimating the SNR of incoming signals.

More precisely, the part of the signal of the MEMS microphone that do not correlate with the other MEMS microphones can be interpreted as the self-noise of the microphone.

If the self-noise of the microphone is too high as compared to the common signal perceived all the MEMS microphones, one can conclude to a degradation of the microphones.

Given the locations $L_M = \{l_1, l_2 \ldots l_M\}$ of the M sound sources found by the above method, one can estimate for each source s the part of the signal it represents in microphone i:

First, the signal of the s is estimated using a beamformer (e.g. a delay-and-sum beamformer); this signal is normalized such that its power is equal to 1. This signal is correlated with the signal of microphone i, and the maximum of cross-correlation is denoted by $\gamma_{i,s}$. The SNR is then computed as $$SNR_i = \frac{\Sigma_S \gamma_{i,s}}{P_{m_i} - \Sigma_S \gamma_{i,s}} \qquad (4)$$

where $P_{m_i}$ is the power of the microphone i output.

An alternative method that may be used in case a single source is detected will now be described. This method may be performed by the block 207 of FIG. 2.

Methods to compute time difference of arrival (TDOA) are well known to the persons skilled in the art (see for example M. Azaria and D. Hertz, "Time delay estimation by generalized cross correlation methods," in IEEE Transactions on Acoustics, Speech, and Signal Processing, vol. 32, no. 2, pp. 280-285, April 1984).

Using these TDOAs, a subset of transducer elements, at least 4 in a three dimensional space, can be used to determine the position of a sound source.

The outliers (i.e., failing acoustic transducers) may be detected using RANSAC.

Another method is to estimate the SNR at each microphone, described hereafter. The method may be combined with a RANSAC.

When a sound source (such as a gas leak) is present in the vicinity of the device, the acoustic waves will reach the microphones at different times, called after time of arrival (TOA). The signal received at a transducer may thus be modelled as:

$$m_i(t) = \alpha_i s(t - \delta_i) + \eta(t) \qquad (5)$$

Where $m_i(t)$ is the output of the MEMS microphone i at time t, s is the incoming signal scaled so that its variance is equal to 1, $\alpha_i > 0$ is the product of the gain of the microphone i with the variance of the incoming signal, $\delta_i$ is the time delay of propagation and $\eta_i$ a centered second-order stationary process, with variance $n_i$, representing the self-noise of microphone i, assumed to be independent on each microphone.

Determining the SNR at each microphone may be done by determining the ratio $$\frac{\alpha_i}{n_i}$$

When two signals of are cross correlated, a maximum appears at the abscissa corresponding to the time difference of arrival (TDOA) of the signal between the two microphones.

$$c_{m_i m_j}(\delta) = \int_t m_i(t) m_j(t - \delta) dt = \qquad (6)$$

$$\alpha_i \alpha_j \int_t s(t - \delta_i) s(t - \delta - \delta_j) dt + E[\eta_i \eta_j] = \alpha_i \alpha_j c_{ss}(\delta + \delta_i - \delta_j) + n_{ij}$$

Where $c_{xy}$ is the cross-correlation between two functions x and y,

I an integration domain.

This function has a global maximum at $\delta_i\text{-}\delta_j$ with value $$c_{M,i,j} = \alpha_i \alpha_j + n_{ij}$$

$$\text{with } n_{ij} = \begin{cases} 0 \text{ if } i \neq j \\ n_i \text{ otherwise} \end{cases}.$$

As a consequence, solving the following equations $$\forall (i,j) \in \{i,j | i \neq j\}, c_{M,i,j} = \alpha_i \alpha_j,$$

provides a system with $$\frac{N(N-1)}{2}$$

equations and N unknowns, where N is the number of microphones.

This system can be solved by taking the logarithm and solving a linear set of equations (using for example the linear least-squares).

The values $n_i$ may deducted by a simple subtraction, and the SNR of each microphone can be computed.

When the SNR of a MEMS microphone is repeatedly below a fixed threshold, this microphone can be invalidated.

In an advantageous embodiment, the system further comprises an alarm module (not represented in FIG. 2) that receives information from the blocks 206, 207, 208.

This alarm module generates messages from the outputs of the blocks 206, 207, 208. Theses messages are transmitted to the output port referenced 33 on FIG. 1 so as to report a possible problem.

This allows informing a user when a MEMS microphone is malfunctioning: replacement and maintenance may therefore be conducted.

The alarm module may comprise a counter for each MEMS microphone. The alarm module may be arranged such that each counter is incremented each time the corresponding MEMS microphone is detected as failing by one of the blocks 206, 207, 208. When a counter reaches a threshold, a message may be sent to the processing blocks to inform that leak detection should no longer be based on signals measured by this microphone and/or a message may be sent to a terminal so as to inform the user that this MEMS microphone is no longer working.

External failure can be temporary such as ice forming on the sensor that prevent the sound from being perceived by the transducers.

Partial failure cases are all detected by the methods described above. Total failure cases or sensing element degradation applying indistinctly to all sensors are addressed in this section.

Total failure of all the sensors for example due to an electrical (surge) or mechanical stress (shock-wave) can result in null sensor output, random noise, correlated outputs.

Null sensor output may be easily detected with a threshold or a test on each sensing elements.

Random noise and correlated outputs may be treated with previously described methods, as, in these two cases, the coherence of the different signals does not depend on the geometry of the array nor the location of external sounds:

(i) for the random noise case, no significant correlation will be detected and random TDOAs will be found indicating a failure;

(ii) for the correlated outputs case (the most trivial case is all the transducers outputting the same signal), all the TDOAs will be equal to 0 indicating a failure as well.

For the case of a planar array it could also corresponds to a sound source perfectly situated in front of the device which can be excluded in most of the cases. One can also use non-planar arrays to avoid the situation.

Partial signal degradation happening similarly on all sensors can be addressed with the multichannel SNR technique estimation described above: when no signal with SNR above the threshold is perceived for a given time (e.g. 10 minutes), then an alarm can be raised.

With the diffuse noise assumption, a score can be calculated (based on of the sum of the absolute differences, described above) and a similar thresholding technique can be used.

Figure 3:
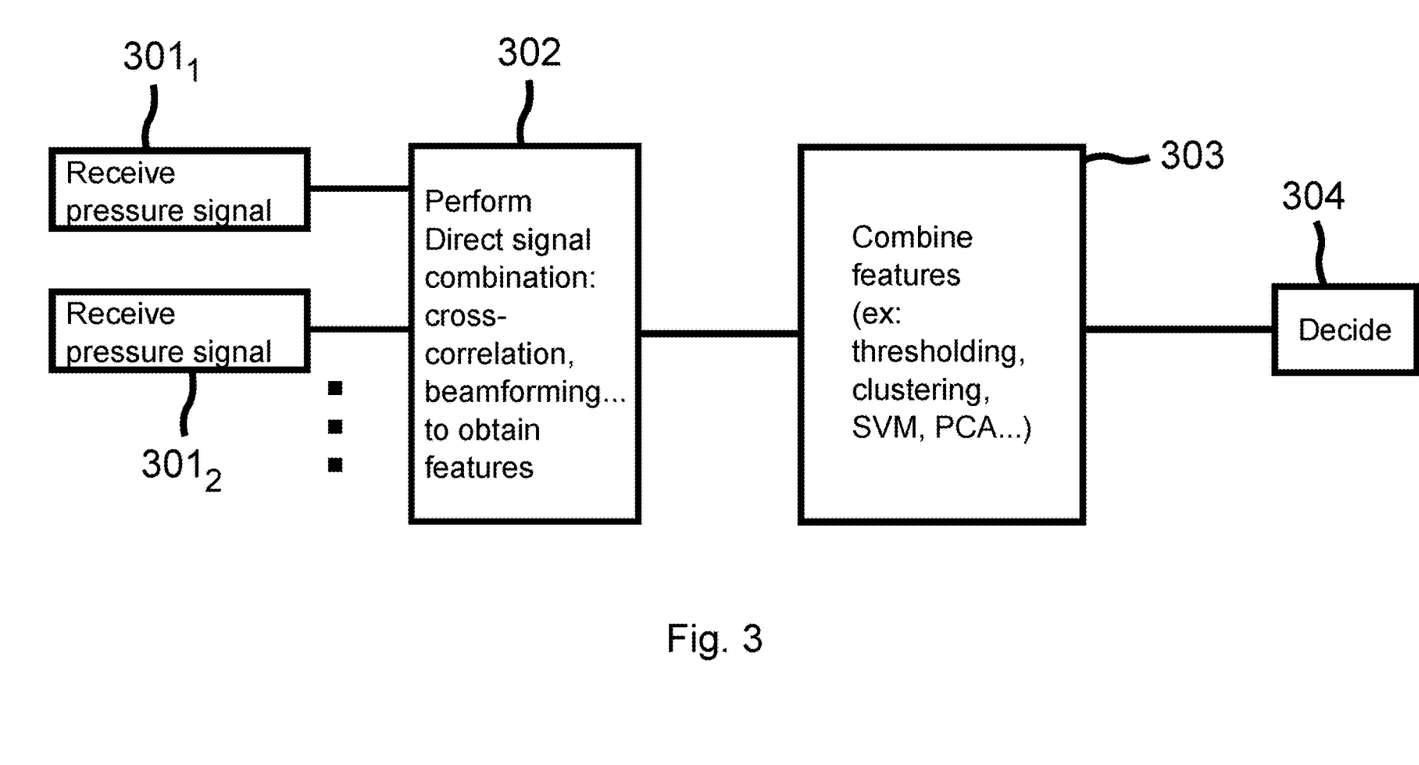
FIG. 3 shows the steps of an example method according to an embodiment of the invention.

FIG. 3 is a flowchart corresponding to an example method according to an embodiment of the invention.

In steps 301$_1$, 301$_2$, . . . , pressure signals measured at corresponding MEMS microphones are received, e.g. at a wireless module, an input port, or so.

Then (step 302), a direct signal combination (said also correlation) is performed. That is, correlation parameters are calculated, each correlation parameter, e.g., a cross correlation function, being obtained from the signals received from a pair of MEMS microphones.

Such features are then combined at step 303, e.g. using a support vector machine (SVM), clustering, principal component analysis (PCA) or so, so as to detect a possible failing microphone.

A decision may be made at step 304 depending on the result of the feature analysis made at step 303.

For example, the decision process may start with the output of the diffuse noise block or the SRP block regarding whether each transducer has a valid output or not. For each transducer, if the transducer has an invalid output (the validity is for example determined by the algorithms described above), an error counter associated with the transducer is incremented; otherwise it is set to 0. If the transducer error counter is greater than a pre-defined threshold, the microphone is marked as defective and excluded of all the calculation in the future.

If a microphone is disabled, the sensor may compute a simulation that will estimate its detection capabilities given the new set of active transducers. If the capabilities are superiors that the limit set at the installation of the sensor, then the sensor may continue its operation. Otherwise the sensor may raise an alert to indicate its malfunction.

This method, with a direct correlation of the received signals (or of invertible transforms thereof) may be more performing than comparing the output power, the spectrum, or a subset of frequency bands, of multiple transducers. For example, if a sound source is present and its echo on the ground is perceived by the microphones, interference fringes will appear making constructive and destructive areas where the acoustic power can vary greatly.

All the methods presented before can be implemented in frequency domain, thus restricted to a certain frequency band. This allow to check the sensor in every sub-band for eventual loss of sensitivity or noise.

The invention claimed is:

1. An internal failure detection method of an external failure detection system for industrial equipment, said external failure detection system comprising an array of transducers, wherein at least two transducers have an overlapping field of view, the method comprising
- (a) receiving ($301_1$, $301_2$, ...) a plurality of signals, each signal being measured by a corresponding transducer of the transducers array,
- (b) for each pair of transducers among a number of pairs of transducers, calculating (302) at least one value of a correlation parameter between the pair of signals received at step (a) at said pair of transducers, by correlating at least part of said signals or of invertible transforms thereof,
- (c) for at least one transducer among said number of pairs of transducers, estimating (303, 304) from the values of the correlation parameters calculated at step (b) if said transducer is working properly.

2. The method of claim 1, further comprising
determining a number of sound sources from the correlation parameters calculated at step (b), and
selecting a transducer condition estimating method depending on the determined number of sources.

3. The method of claim 2, wherein determining a number of sound sources comprises
at step (b), calculating a correlation parameter for each pair of transducers taken from a set of transducers,
estimating eigenvalues of a correlation matrix of the correlation parameters calculated at step (b),
counting the number of estimated eigenvalues that are higher than a threshold,
if said counted number is higher than a number threshold, or equals zero, considering that the number of sources is zero,
otherwise, considering that the number of sources equals the counted number.

4. The method of claim 3, wherein the method comprises
in particular when a determined number of sound sources equals zero, for at least one correlation parameter calculated at step (b), comparing said calculated correlation parameter to a theoretical value obtained based on a diffuse noise field model.

5. The method of claim 3, wherein, the method comprises
in particular when a determined number of sound sources equals zero, for at least one transducer, comparing to a threshold at least one correlation parameter obtained at step (b) from the signal received at said transducer and from the signal received at a distinct transducer that is considered as being located near said transducer.

6. The method according to claim 3, wherein the method comprises, in particular when a determined number of sound sources equals one or more,
selecting at least two different subsets of transducers, each subset of transducers comprising a number of transducers that is smaller than the number of active transducers within the array,
for each selected subset of transducers, for at least one detected source, estimating from the signals received at step (a) at the transducers of said subset, a location of said source,
checking that the at least two estimated locations of said source are consistent.

7. The method of claim 2, wherein the method comprises
in particular when a determined number of sound sources equals zero, for at least one correlation parameter calculated at step (b), comparing said calculated correlation parameter to a theoretical value obtained based on a diffuse noise field model.

8. The method of claim 2, wherein, the method comprises
in particular when a determined number of sound sources equals zero, for at least one transducer, comparing to a threshold at least one correlation parameter obtained at step (b) from the signal received at said transducer and from the signal received at a distinct transducer that is considered as being located near said transducer.

9. The method according to claim 2, wherein the method comprises, in particular when a determined number of sound sources equals one or more,
selecting at least two different subsets of transducers, each subset of transducers comprising a number of transducers that is smaller than the number of active transducers within the array,
for each selected subset of transducers, for at least one detected source, estimating from the signals received at step (a) at the transducers of said subset, a location of said source,
checking that the at least two estimated locations of said source are consistent.

10. The method of claim 2, wherein the method comprises
in particular when a determined number of sound sources equals zero, for at least one correlation parameter calculated at step (b), comparing said calculated correlation parameter to a theoretical value obtained based on a diffuse noise field model.

11. The method of claim 10, wherein, the method comprises
in particular when a determined number of sound sources equals zero, for at least one transducer, comparing to a threshold at least one correlation parameter obtained at step (b) from the signal received at said transducer and from the signal received at a distinct transducer that is considered as being located near said transducer.

12. The method according to claim 10, wherein the method comprises, in particular when a determined number of sound sources equals one or more,
selecting at least two different subsets of transducers, each subset of transducers comprising a number of transducers that is smaller than the number of active transducers within the array,
for each selected subset of transducers, for at least one detected source, estimating from the signals received at step (a) at the transducers of said subset, a location of said source,
checking that the at least two estimated locations of said source are consistent.

13. The method of claim 2, wherein, the method comprises
in particular when a determined number of sound sources equals zero, for at least one transducer, comparing to a threshold at least one correlation parameter obtained at step (b) from the signal received at said transducer and from the signal received at a distinct transducer that is considered as being located near said transducer.

14. The method according to claim 13, wherein the method comprises, in particular when a determined number of sound sources equals one or more,
selecting at least two different subsets of transducers, each subset of transducers comprising a number of transducers that is smaller than the number of active transducers within the array,
for each selected subset of transducers, for at least one detected source, estimating from the signals received at step (a) at the transducers of said subset, a location of said source,
checking that the at least two estimated locations of said source are consistent.

15. The method according to claim 2, wherein the method comprises, in particular when a determined number of sound sources equals one or more, selecting at least two different subsets of transducers, each subset of transducers comprising a number of transducers that is smaller than the number of active transducers within the array, for each selected subset of transducers, for at least one detected source, estimating from the signals received at step (a) at the transducers of said subset, a location of said source, checking that the at least two estimated locations of said source are consistent.

16. The method according to claim 2, wherein, in particular when the determined number of sound sources equals one, the method comprises for at least one pair of two transducers, computing a convolutional product from the signals received at said transducers, determining from the at least one computed convolutional product a signal to noise ratio for at least one transducer, comparing the determined signal to noise ratio to a threshold to estimate the state of the corresponding transducer.

17. The method according to claim 1, wherein the correlation parameter calculated at step (b) from the signals received at a pair of transducers may be a cross spectral density between said received signals.

18. A non-transitory computer readable medium storing computer executable code which when executed by a processor causes the processor to carry out the method of claim 1.

19. An internal failure detection device for an external failure detection system for industrial equipment, said external failure detection system comprising an array of transducers, wherein at least two transducers have an overlapping field of view, the internal failure detection device comprising receiving means ($201_1$, $201_2$, ..., $201_N$) to receive a plurality of signals, each signal being measured by a corresponding transducer of the array of transducers, processing means (204, 205, 206, 207, 208) arranged to, for each pair of transducers among a number of pairs of transducers, calculate at least one value of a correlation parameter between the received signals corresponding to said pair of transducers, by correlating at least part of said signals or of invertible transforms thereof, and to, for at least one transducer of the number of transducers, estimate from the calculated values of the correlation parameter if this transducer is working properly, and transmitting means to transmit a signal generated as a function of the result of the estimating so as to report a possible transducer failure.

20. An external failure detection system (1) for industrial equipment, comprising an array (4) of transducers (2), at least two transducers having an overlapping field of view, and an internal failure detection device (3) as recited in claim 19 to detect a possible failure of one or several of the transducers of said array.

* * * * *